(12) United States Patent
Huang

(10) Patent No.: US 8,380,772 B2
(45) Date of Patent: Feb. 19, 2013

(54) MULTI-RATE FILTER BANK

(75) Inventor: Kung-Piao Huang, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 675 days.

(21) Appl. No.: 12/637,771

(22) Filed: Dec. 15, 2009

(65) Prior Publication Data

US 2011/0087716 A1 Apr. 14, 2011

(30) Foreign Application Priority Data

Oct. 14, 2009 (TW) .............................. 98134796 A

(51) Int. Cl.
*G06F 17/10* (2006.01)
(52) U.S. Cl. .................. 708/313; 708/316; 708/319
(58) Field of Classification Search .................. None
See application file for complete search history.

(56) References Cited

U.S. PATENT DOCUMENTS

| | | | |
|---|---|---|---|
| 5,384,869 A * | 1/1995 | Wilkinson et al. | 382/240 |
| 5,872,480 A * | 2/1999 | Huang | 329/304 |
| 6,993,464 B2 * | 1/2006 | Chiu et al. | 703/2 |
| 2009/0177726 A1 * | 7/2009 | Bury | 708/313 |

FOREIGN PATENT DOCUMENTS

TW 200828794 7/2008

OTHER PUBLICATIONS

"Office Action of Taiwan Counterpart Application", issued on Nov. 7, 2012, p1-p3, in which the listed reference was cited.

* cited by examiner

*Primary Examiner* — Ilwoo Park
(74) *Attorney, Agent, or Firm* — Jianq Chyun IP Office

(57) ABSTRACT

A multi-rate filter bank including an anti-aliasing filter, a plurality of multiplier block modules, a folding block, and a data composer is disclosed. The anti-aliasing filter receives an anti-aliasing input signal. The multiplier block modules receive an original signal and sequentially generate a plurality of processed signals. The multiplier block modules also receive a plurality of block input signals and a select signal. Each of the multiplier block modules is configured into a decimation block or an expanding anti-aliasing filter according to the select signal. The folding block receives the select signal and a folding input signal and generates a folding block output signal. The data composer receives and composes the folding block output signal and the outputs of the multiplexer block modules and the anti-aliasing filter and generates an anti-aliasing filter output signal.

14 Claims, 8 Drawing Sheets

MULTI-RATE FILTER BANK

CROSS-REFERENCE TO RELATED APPLICATION

This application claims the priority benefit of Taiwan application serial no. 98134796, filed on Oct. 14, 2009. The entirety of the above-mentioned patent application is hereby incorporated by reference herein and made a part of specification.

BACKGROUND OF THE INVENTION

1. Field of the Invention

The present invention relates to a multi-rate filter bank.

2. Description of Related Art

FIG. 1 is a diagram of a conventional multi-rate filter bank 100. Referring to FIG. 1, the conventional multi-rate filter bank 100 includes a multiplexer 110, decimators 120~150, and an anti-aliasing filter 180. The decimators 120, 130, 140, and 150 are sequentially connected with each other in series. The first decimator 120 receives an original signal DATA and decimates the same to generate a processed signal, and the decimator 130 connected after the decimator 120 receives the processed signal from the decimator 120. Similarly, the decimators 140 and 150 respectively receive processed signals from their previous decimators 130 and 140.

The multiplexer 110 receives the original signal DATA and the signals respectively generated by the decimators 120~150. The multiplexer 110 further receives a select signal DecfSEL and outputs the original signal DATA or one of the signals generated by the decimators 120~150 to the anti-aliasing filter 180 according to the select signal Decf SEL. The anti-aliasing filter 180 performs anti-aliasing filtering on the received signal and generates an anti-aliasing filter output signal AAFOUT.

In the conventional multi-rate filter bank 100, the multiplexer 110 only outputs one of the input signals to the anti-aliasing filter 180 at a single time point. Namely, not all the decimators 120~150 work at a single time point. For example, none of the decimators 120~150 works when the multiplexer 110 outputs the original signal DATA, and none of the decimators 130~150 works when the multiplexer 110 outputs the signal generated by the decimator 120. It can be understood from foregoing description that when a decimator does not work, the internal circuit (for example, a plurality of multipliers) thereof is idled. As a result, the performance of the entire multi-rate filter bank is lowered.

SUMMARY OF THE INVENTION

Accordingly, the present invention is directed to a multi-rate filter bank, wherein a plurality of multipliers of the multi-rate filter bank is shared in different operation modes so that the performance of the entire multi-rate filter bank is improved.

The present invention provides a multi-rate filter bank including an anti-aliasing filter, a plurality of multiplier block modules, a folding block, and a data composer. The anti-aliasing filter receives an anti-aliasing input signal. The multiplier block modules are sequentially connected with each other in series to receive an original signal and sequentially generate a plurality of processed signals. The multiplier block modules also receive a plurality of block input signals and a select signal. Each of the multiplier block modules is configured into a decimation block or an expanding anti-aliasing filter according to the select signal. The folding block receives the select signal and a folding input signal and accumulates the anti-aliasing input signal and the block input signals received by the multiplier block modules that are configured into decimation blocks according to the select signal to generate a folding block output signal. The data composer is coupled to the anti-aliasing filter, the folding block, and the multiplier block modules. The data composer receives and composes the folding block output signal and the outputs of the multiplier block modules and the anti-aliasing filter and generates an anti-aliasing filter output signal.

According to an embodiment of the present invention, the multi-rate filter bank further includes a multiplexer and a data delay device. The multiplexer is coupled to the multiplier block modules for receiving the original signal, the processed signals, and the select signal. The multiplexer outputs the original signal or one of the signals output by the multiplier block modules according to the select signal. The data delay device is coupled to the multiplexer for receiving the output of the multiplexer and a plurality of calculation parameters. The data delay device delays the output of the multiplexer and performs a calculation based on the calculation parameters to generate the anti-aliasing input signal, the block input signals, and the folding input signal.

According to an embodiment of the present invention, each of the multiplier block modules has a block index, and if the select signal is not smaller than the block index of each of the multiplier block modules, the multiplier block modules are configured into decimation blocks.

According to an embodiment of the present invention, if the select signal is smaller than the block index of each of the multiplier block modules, the multiplier block modules are configured into expanding anti-aliasing filters.

According to an embodiment of the present invention, each of the multiplier block modules includes a multiplier block and an anti-aliasing filter data switching circuit, wherein the multiplier block receives a part of the block input signals and the select signal, and the anti-aliasing filter data switching circuit coupled to the multiplier block receives the select signal and outputs the output of the multiplier block or a constant according to the select signal.

According to an embodiment of the present invention, the constant is 0.

According to an embodiment of the present invention, the anti-aliasing filter data switching circuit is a selector.

According to an embodiment of the present invention, the calculation parameters include a plurality of decimation parameters and a plurality of anti-aliasing parameters.

According to an embodiment of the present invention, each of the multiplier blocks includes a data delay device, at least one first shared multiply-adder, a first data composition unit, a decimation unit, and a select unit. The data delay device receives and delays the original signal or one of the processed signals to generate a plurality of delayed signals. The first shared multiply-adder is coupled between the data delay device and the first data composition unit. The first shared multiply-adder performs an arithmetical calculation on the delayed signals and the decimation parameters or the block input signals and the anti-aliasing parameters according to the select signal to obtain a plurality of products. The first data composition unit is coupled to the first shared multiply-adder and which composes the products to generate a composition result. The decimation unit is coupled to the first data composition unit and which decimates the composition result. The select unit is coupled to the decimation unit and the first data composition unit and which outputs the composition result or the decimated composition result according to the select signal.

According to an embodiment of the present invention, each of the first shared multiply-adders includes a first select unit, a second select unit, a third select unit, an adder unit, and a multiplication unit. The first select unit outputs the decimation parameters or the anti-aliasing parameters according to the select signal. The second select unit outputs one of the delayed signals or one of the block input signals according to the select signal. The third select unit outputs another one of the delayed signals or another one of the block input signals according to the select signal. The adder unit is coupled to the second select unit and the third select unit and which performs an addition on the outputs of the second select unit and the third select unit. The multiplication unit is coupled to the first select unit and the adder unit and which performs a multiplication on the outputs of the first select unit and the adder unit.

According to an embodiment of the present invention, the folding block includes at least one second shared multiply-adder, a second data composition unit, and an accumulation unit. The second shared multiply-adder receives the select signal, the folding input signal, and the calculation parameters and performs a calculation on the select signal, the folding input signal, and the calculation parameters to obtain at least one product. The second data composition unit is coupled to the second shared multiply-adder unit and which composes the product to obtain a composition result. The accumulation unit is coupled to the second data composition unit and which accumulates the composition result to generate the folding block output signal.

According to an embodiment of the present invention, the folding block further includes a folding block state generator coupled to the accumulation unit, wherein the folding block state generator includes an adder, a selector, and a delay device. The adder receives a folding block state and adds 1 to the folding block state to generate an incremental folding block state. The selector is coupled to the adder and which outputs the incremental folding block state or the folding block state by comparing the select signal with the folding block state. The delay device is coupled to the selector and which delays the output of the selector and generates the folding block state.

According to an embodiment of the present invention, the accumulation unit determines the number of accumulations to be performed according to the folding block state.

According to an embodiment of the present invention, the second shared multiply-adder includes a first select unit, a second select unit, a third select unit, an adder unit, and a multiplication unit. The first select unit sequentially outputs the anti-aliasing parameters according to the folding block state. The second select unit sequentially outputs a part of the folding input signal according to the folding block state. The third select unit sequentially outputs a part of the folding input signal according to the folding block state. The adder unit is coupled to the second select unit and the third select unit and which performs an addition on the outputs of the second select unit and the third select unit. The multiplication unit is coupled to the first select unit and the adder unit and which performs a multiplication on the outputs of the first select unit and the adder unit.

As described above, in the present invention, the number of decimation blocks required by a multi-rate filter bank is determined according to a select signal, so as to configure multiplier block modules into the decimation blocks, and those multiplier block modules that are not configured into the decimation blocks are configured into expanding anti-aliasing filters so that all the multipliers in the multi-rate filter bank can be efficiently used. Thereby, different number of idling multipliers in different application is avoided and accordingly the performance of the entire circuit is improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
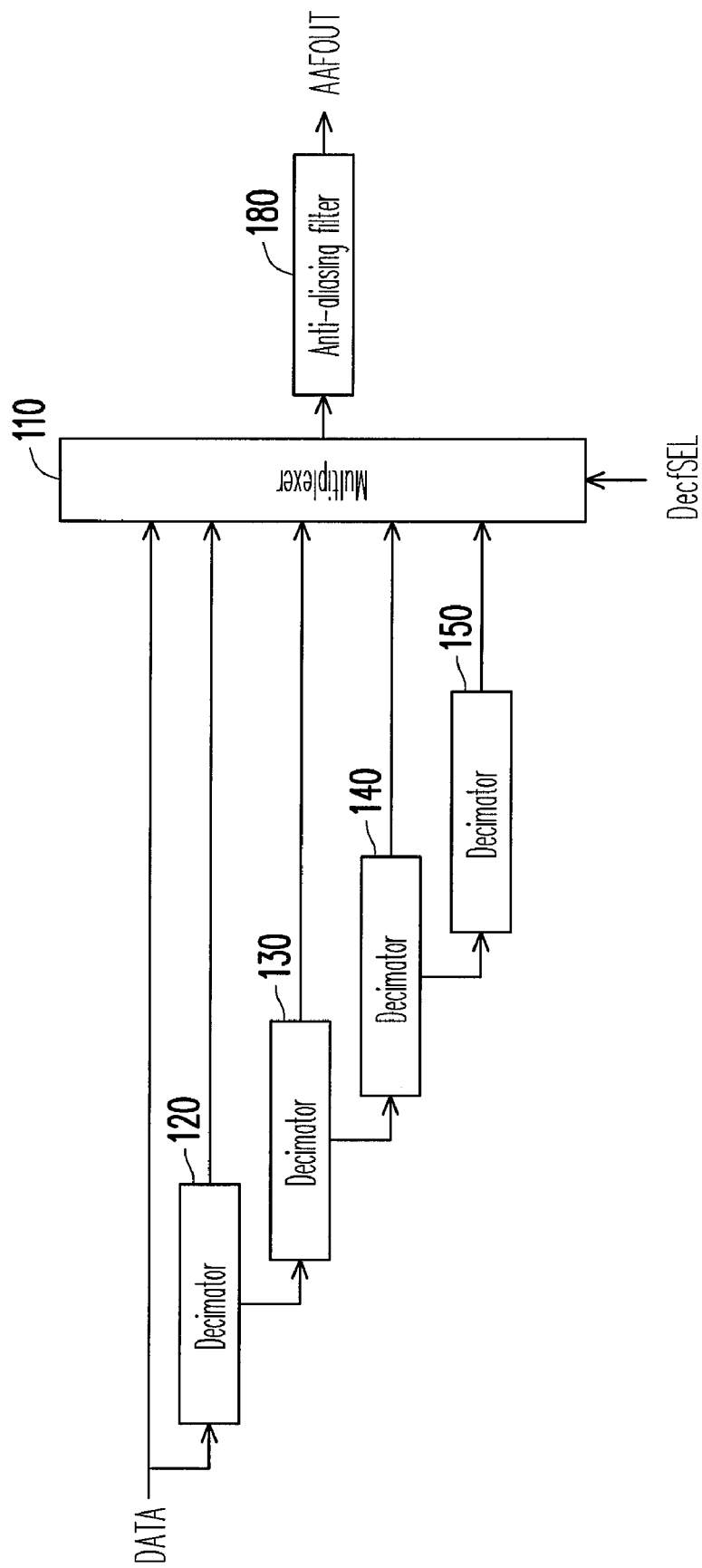
FIG. 1 is a diagram of a conventional multi-rate filter bank 100.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
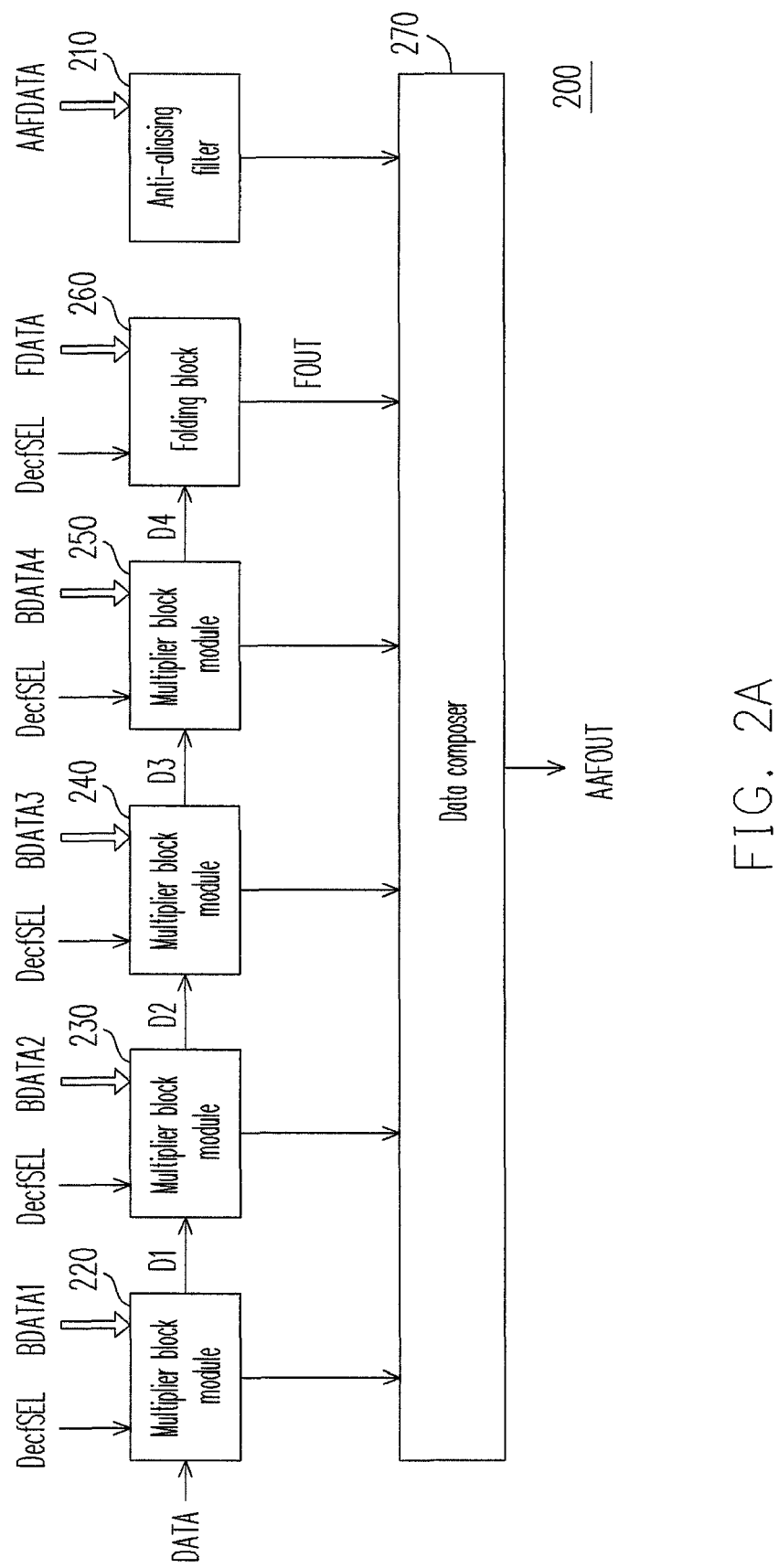
FIG. 2A is a diagram of a multi-rate filter bank 200 according to an embodiment of the present invention.

FIG. 2A is a diagram of a multi-rate filter bank 200 according to an embodiment of the present invention. Referring to FIG. 2A, the multi-rate filter bank 200 includes an anti-aliasing filter 210, multiplier block modules 220~250, a folding block 260, and a data composer 270. The multiplier block modules 220~250 are sequentially connected with each other in series. The first multiplier block module 220 receives an original signal DATA, and the multiplier block modules 220~250 sequentially generate processed signals D1~D4. To be specific, the multiplier block module 220 receives the original signal DATA, generates a processed signal D1 according to the original signal DATA, and then sends the processed signal D1 to the subsequent multiplier block module 230. The multiplier block module 230 receives the processed signal D1 generated by the multiplier block module 220 and generates a processed signal D2 according to the processed signal D1. Similarly, each multiplier block module receives the processed signal generated by the previous multiplier block module, generates another processed signal according to the received processed signal, and sends the newly generated processed signal to the next multiplier block module.

In addition, the multiplier block modules 220~250 all receive a select signal DecfSEL and respectively receive different block input signals BDATA1~BDATA4. The folding block 260 also receives the select signal DecfSEL. Besides, the folding block 260 receives a folding input signal FDATA and generates a folding block output signal FOUT according to the folding input signal FDATA. The anti-aliasing filter 210 receives an anti-aliasing input signal AAFDATA.

It should be noted that each of the multiplier block modules 220~250 has a block index. In the present embodiment, the block index of the multiplier block module 220 is 1, the block index of the multiplier block module 230 is 2, and the block indexes of the multiplier block modules 240~250 are respectively 3 and 4. Each of the multiplier block modules 220~250 determines whether it should be configured into a decimation block or an expanding anti-aliasing filter by comparing the select signal DecfSEL with the block index thereof.

For example, if the select signal DecfSEL is 0, all the multiplier block modules 220~250 are configured into expanding anti-aliasing filters since the block indexes of the multiplier block modules 220~250 are all greater than the select signal DecfSEL. If the select signal DecfSEL is 1, the multiplier block module 220 is configured into a decimation block and the multiplier block modules 230~250 are configured into expanding anti-aliasing filters since the block index of the multiplier block module 220 is not greater than the select signal DecfSEL while the block indexes of the multiplier block modules 230~250 are greater than the select signal DecfSEL.

How the multiplier block modules 220~250 are configured along with different select signal DecfSEL should be understood from foregoing two examples therefore will not be further described herein. If a multiplier block module is configured into a decimation block, the multiplier block module performs a decimation action. Contrarily, if a multiplier block module is configured into an expanding anti-aliasing filter, a shared multiply-adder of the multiplier block module is provided to the anti-aliasing filter 210 to increase the taps of the anti-aliasing filter 210.

The data composer 270 is coupled to the multiplier block modules 220~250, the folding block 260, and the anti-aliasing filter 210. The data composer 270 receives and composes the folding block output signal FOUT and the outputs of the multiplier block modules 220~250 and the anti-aliasing filter 210 to generate an anti-aliasing filter output signal AAFOUT.

Figure 2B:
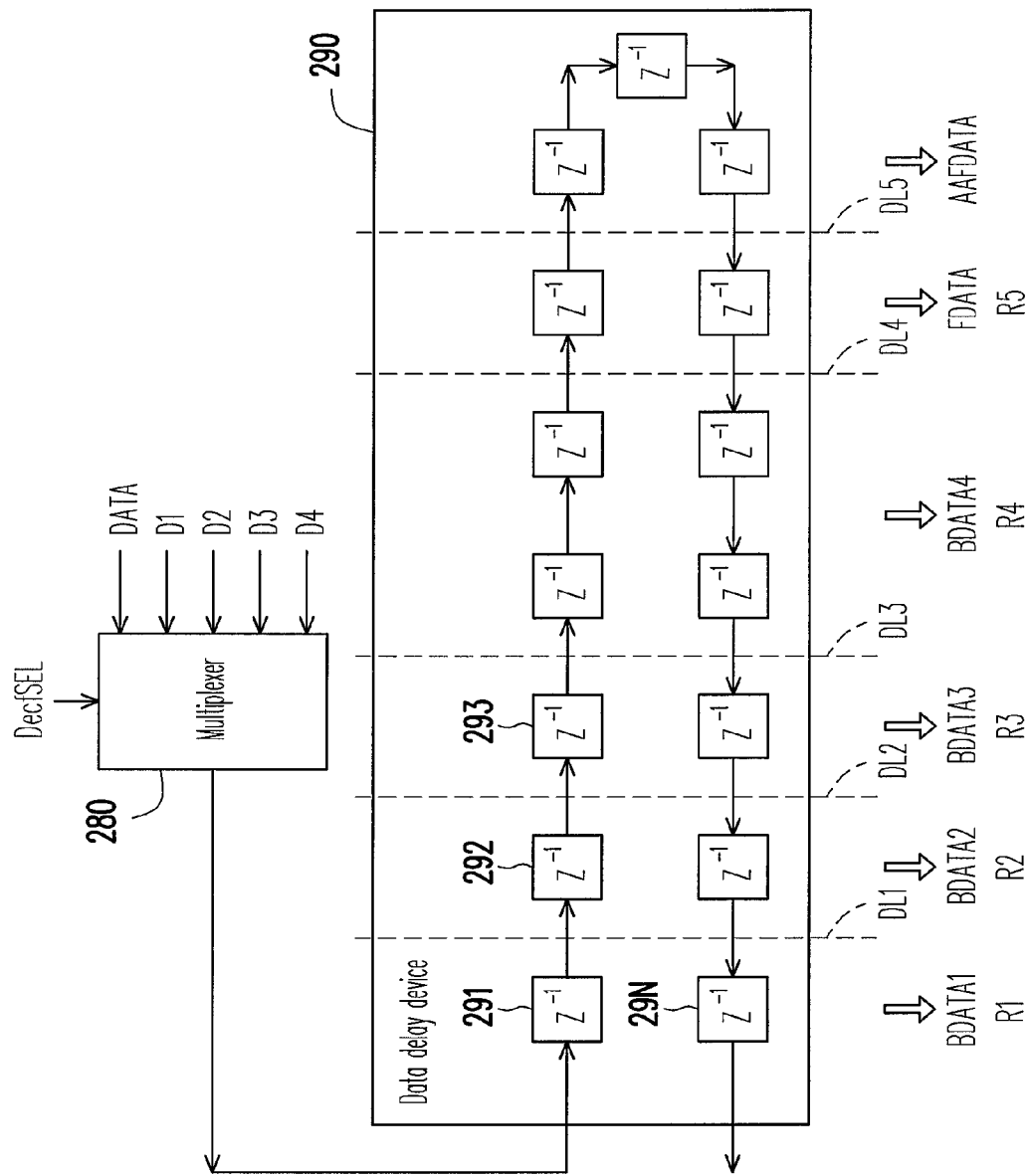
FIG. 2B is a diagram illustrating how a plurality of block input signals, a folding input signal, and an anti-aliasing input signal are generated in the multi-rate filter bank 200.

FIG. 2B is a diagram illustrating how the block input signals, the folding input signal, and the anti-aliasing input signal are generated in the multi-rate filter bank 200. As shown in FIG. 2B, the multi-rate filter bank 200 further includes a multiplexer 280 and a data delay device 290. The multiplexer 280 receives the original signal DATA, the processed signals D1~D4, and the select signal DecfSEL and outputs the original signal DATA or one of the processed signals D1~D4 according to the select signal DecfSEL.

The data delay device 290 is composed of a plurality of delay units 291~29N that are connected with each other in series. The data delay device 290 is divided into a plurality of regions according to the total number of the anti-aliasing filter, the multiplier block modules, and the folding block. In the present embodiment, the data delay device 290 is divided into 6 regions along the dotted lines DL1~DL5. The region to the left of the dotted line DL1 is used for generating the block input signal BDATA1 and a calculation parameter R1 that is provided to the multiplier block module 220. The region between the dotted lines DL1 and DL2 is used for generating the block input signal BDATA2 and a calculation parameter R2 that provided to the multiplier block module 230. Similarly, the block input signals BDATA1~BDATA4, the folding input signal FDATA, the anti-aliasing input signal AAFDATA, and the calculation parameters R1~R5 generated corresponding to different regions can be obtained. Besides, the folding input signal FDATA is a combination of the block input signals BDATA1~BDATA4 and a block input signal BDATA5, and which may also be expressed as FDATA={BDATA1, BDATA2, BDATA3, BDATA4, BDATA5}.

It should be mentioned that the calculation parameters R1~R5 are decimation parameters if they are provided to the multiplier block modules that are configured into decimation blocks, and the calculation parameters R1~R5 are anti-aliasing parameters if they are provided to the multiplier block modules that are configured into expanding anti-aliasing filters.

Figure 3:
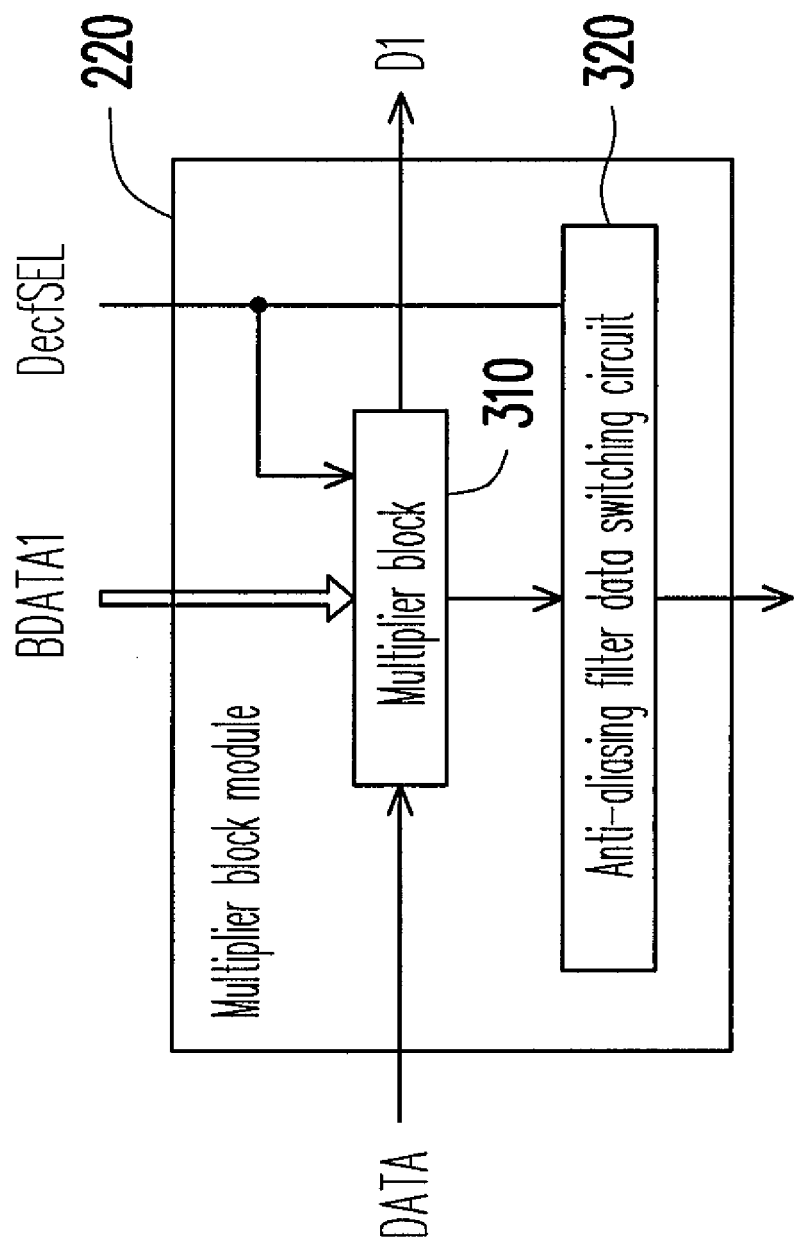
FIG. 3 illustrates an implementation of a multiplier block module 220 according to an embodiment of the present invention.

FIG. 3 illustrates an implementation of the multiplier block module 220 according to an embodiment of the present invention. Referring to FIG. 2A and FIG. 3, the multiplier block module 220 includes a multiplier block 310 and an anti-aliasing filter data switching circuit 320. The multiplier block 310 receives the block input signal BDATA1 and the select signal DecfSEL. Besides, since the multiplier block module 220 is connected at the first place, the multiplier block 310 also receives the original signal DATA. The multiplier block 310 decimates the original signal DATA to generate the processed signal D1. The anti-aliasing filter data switching circuit 320 may be implemented by using a selector (not shown). If the multiplier block module 220 is configured into an expanding anti-aliasing filter according to the select signal DecfSEL, the anti-aliasing filter data switching circuit 320 outputs the output of the multiplier block 310, and contrarily, if the multiplier block module 220 is configured into a decimation block according to the select signal DecfSEL, the anti-aliasing filter data switching circuit 320 outputs a constant, wherein the constant may be 0.

It should be especially noted that the circuit illustrated in FIG. 3 is not only used for implementing the multiplier block module 220 that is connected at the first place. Instead, the circuit illustrated in FIG. 3 may also be used for implementing the multiplier block modules 230~250 connected at other places.

Figure 4:
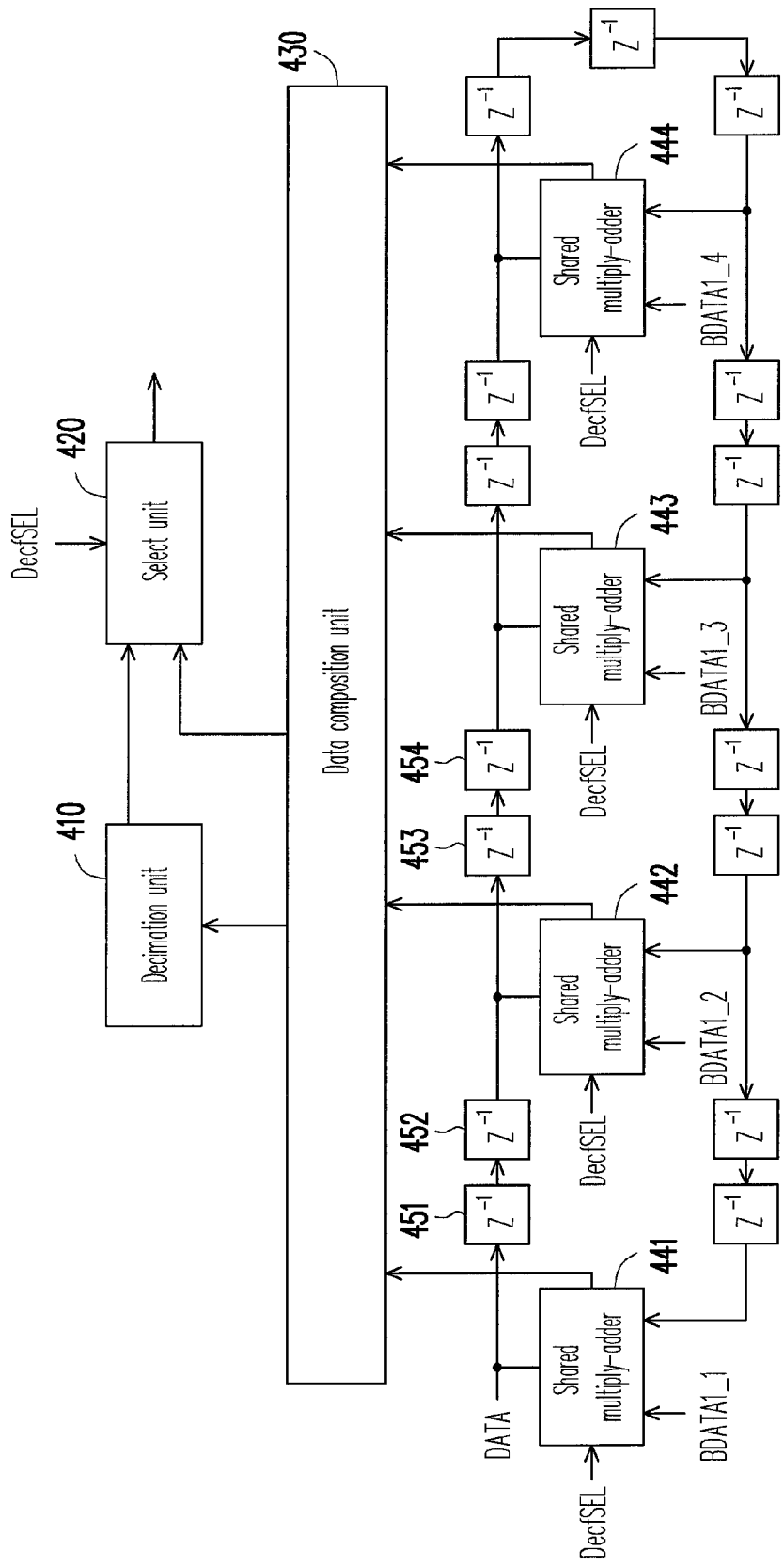
FIG. 4 illustrates an implementation of a multiplier block 310 according to an embodiment of the present invention.

FIG. 4 illustrates an implementation of the multiplier block 310 according to an embodiment of the present invention. Referring to FIG. 4, the multiplier block 310 includes a decimation unit 410, a select unit 420, a data composition unit 430, shared multiply-adders 441~444, and a data delay device composed of delay units 451~45N. The delay unit 451 in the data delay device receives the original signal DATA and generates a plurality of delayed signals according to the original signal DATA. These delayed signals are respectively sent to the shared multiply-adders 441~444 coupled to the data delay device. The shared multiply-adders 441~444 further receive the select signal DecfSEL and performs an arithmetical calculation on the original signal DATA or the delayed signals and decimation parameters among the calculation parameters or on the block input signals BDATA1_1~BDATA1_4 and anti-aliasing parameters among the calculation parameters according to the select signal DecfSEL so as to obtains a plurality of products.

The data composition unit 430 is coupled to the shared multiply-adders 441~444 and which receives and composes the products output by the shared multiply-adders 441~444 to output a composition result. The decimation unit 410 is coupled to the data composition unit 430 and which receives and decimates the composition result. The select unit 420 is coupled to the decimation unit 410 and the data composition unit 430, and which outputs the output of the decimation unit 410 or the composition result of the data composition unit 430 according to the select signal DecfSEL.

Besides the multiplier block 310 in the multiplier block module 220 connected at the first place, multiplier blocks in other multiplier block modules may also be implemented with the circuit illustrated in FIG. 4. For example, if the multiplier block 310 in multiplier block module 230 is implemented with the circuit illustrated in FIG. 4, the data delay device receives the processed signal D1.

In addition, the number of the shared multiply-adders 441~444 in the present embodiment is only an example, and any number of shared multiply-adders may be disposed according to the actual requirement.

Figure 5:
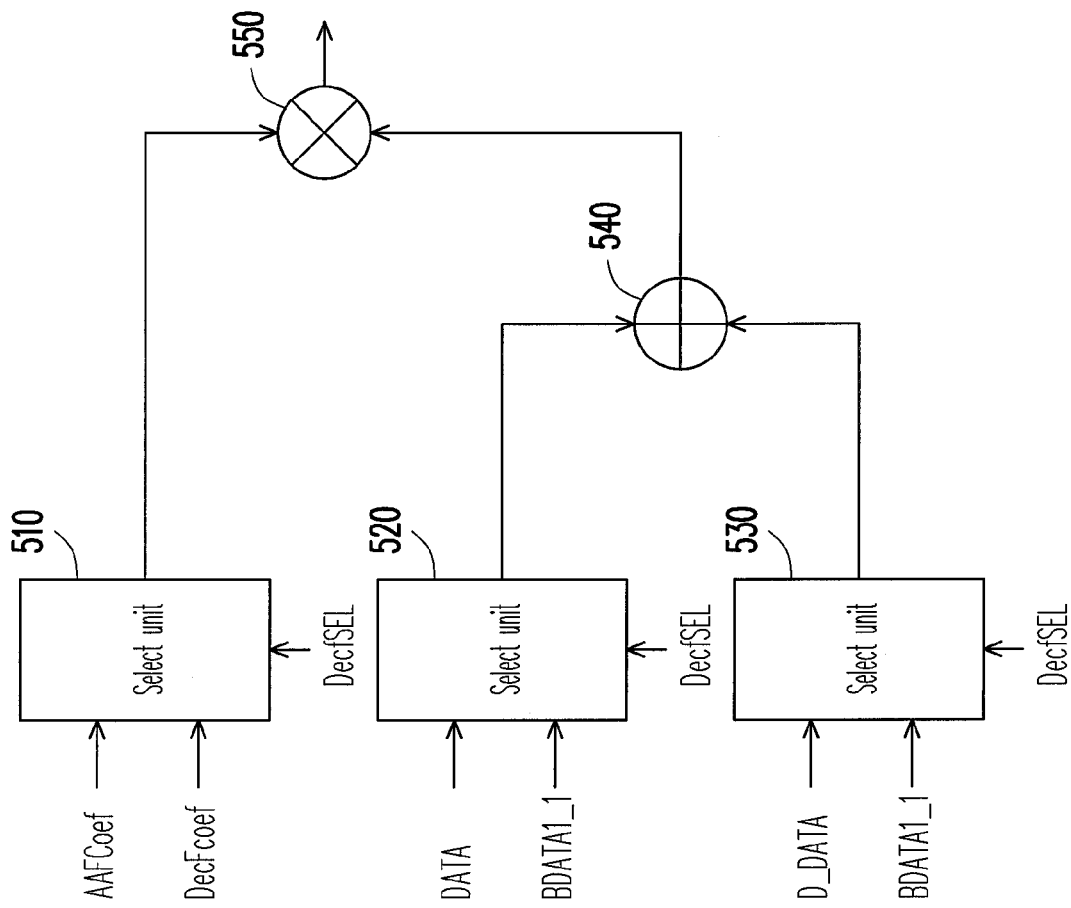
FIG. 5 illustrates an implementation of a shared multiply-adder 441 according to an embodiment of the present invention.

FIG. 5 illustrates an implementation of the shared multiply-adder 441 according to an embodiment of the present invention. Referring to FIG. 5, the shared multiply-adder 441 includes select units 510, 520, and 530, an adder unit 540, and a multiplication unit 550. The select unit 510 outputs the decimation parameter DecFcoef or the anti-aliasing parameter AAFcoef according to the select signal DecfSEL. The select unit 520 outputs the original signal DATA output by the delay unit 45N illustrated in FIG. 4 or the block input signal BDATA1_1 according to the select signal DecfSEL. The select unit 530 outputs the delayed signal D_DATA or the block input signal BDATA1_1 according to the select signal DecfSEL.

In addition, the adder unit 540 is coupled to the select units 520 and 530, and which adds up the outputs of the select units 520 and 530. The multiplication unit 550 is coupled to the select unit 510 and the adder unit 540 and which multiplies the outputs of the select unit 510 and the adder unit 540.

Herein the pattern of the select units 510~530 outputting signals according to the select signal DecfSEL is the same as the pattern of the corresponding multiplier block modules being configured into decimation blocks or expanding anti-aliasing filters according to the select signal DecfSEL. Namely, when the multiplier block modules corresponding to the select units 510~530 are configured into decimation blocks, the select units 510~530 respectively output the decimation parameter DecFcoef, the original signal DATA, and the delayed signal D_DATA. Contrarily, when the multiplier block modules corresponding to the select units 510~530 are configured into expanding anti-aliasing filters, the select units 510~530 output the anti-aliasing parameter AAFcoef and the block input signal BDATA_1.

Figure 6:
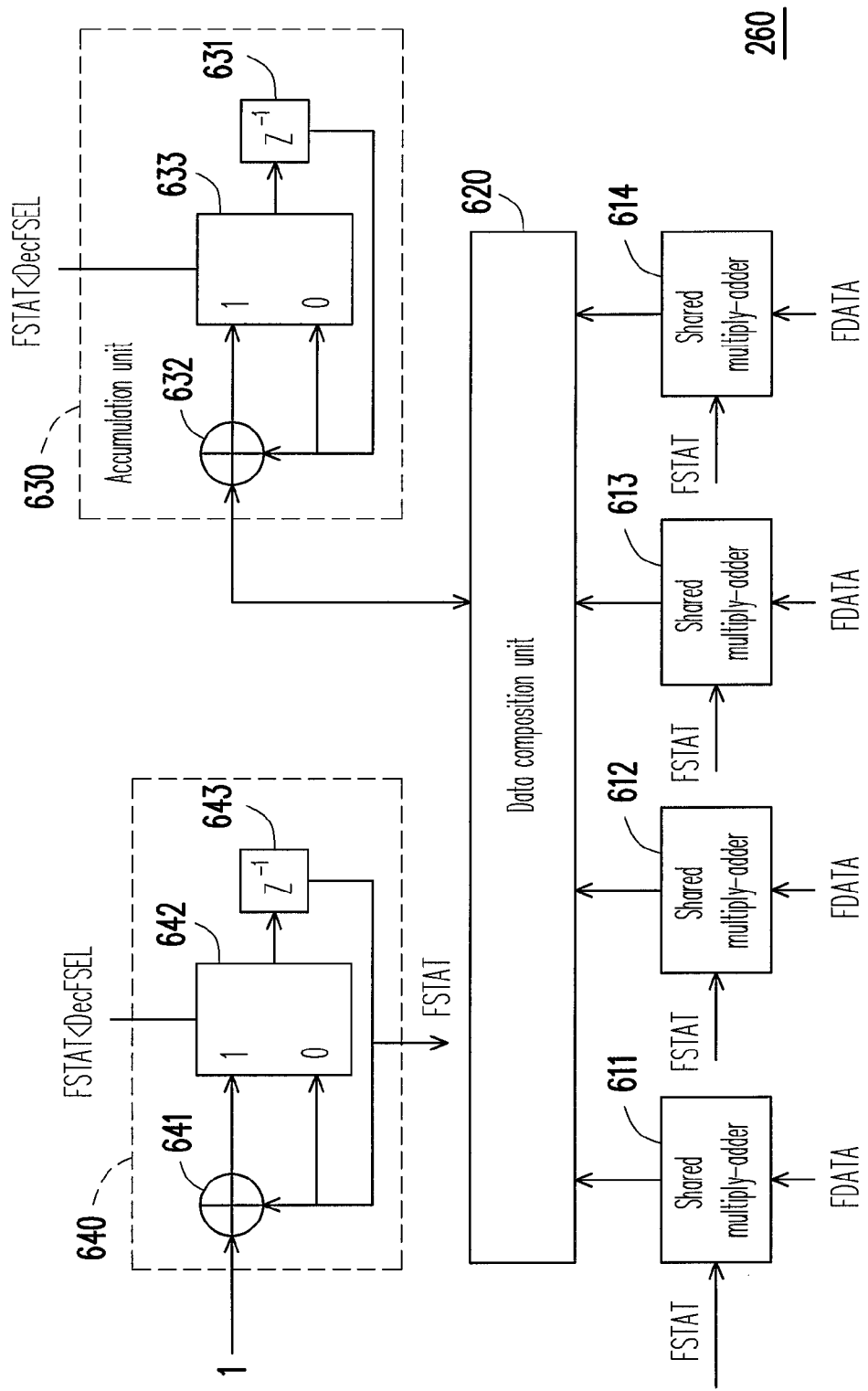
FIG. 6 illustrates an implementation of a folding block 260 according to an embodiment of the present invention.

FIG. 6 illustrates an implementation of the folding block 260 according to an embodiment of the present invention. Referring to FIG. 6, the folding block 260 includes shared multiply-adders 611~614, a data composition unit 620, an accumulation unit 630, and a folding block state generator 640. The shared multiply-adders 611~614 receive the select signal DecfSEL, the folding input signal FDATA, and calculation parameters and performs a calculation on the select signal DecfSEL, the folding input signal FDATA, and the calculation parameters to obtain a product.

The data composition unit 620 receives and composes the products obtained by all the shared multiply-adders 611~614 to obtain a composition result. The accumulation unit 630 accumulates the composition result generated by the data composition unit 620 to generate a folding block output signal. The accumulation unit 630 includes a delay unit 631, an adder unit 632, and a select unit 633, and which accumulates a plurality of delayed composition result. The number of accumulations to be performed by the accumulation unit 630 in FIG. 6 is determined according to a folding block state FSTAT (i.e., equal to the value of the select signal DecFSEL). The select signal DecFSEL represents how many multiplier block modules are served as decimation blocks, and the folding block 260 has to fold the inputs and coefficients of the anti-aliasing filters which these multiplier block modules are originally served as. Accordingly, the folding number is equal to the value of the select signal DecFSEL.

This will be explained with a simple example. When the select signal DecFSEL is 0 (i.e., all the multiplier block modules 220~250 are configured into expanding anti-aliasing filters), the anti-aliasing filter output signal AAFOUT is generated by the multiplier block modules 220~250, the folding block 260, and the anti-aliasing filter 210. In addition, when the select signal DecFSEL is 1 (i.e., one of the multiplier block modules 220~250 (for example, the multiplier block module 220) is configured into a decimation block), the anti-aliasing filter output signal AAFOUT is generated by the multiplier block modules 230~250, the folding block 260, and the anti-aliasing filter 210, which is one block less than the case with the select signal DecFSEL as 0. Fortunately, since the multiplier block module 220 decimates the original signal DATA, the multi-rate filter bank 200 acquires one more clock to operate, so that the folding block 260 can perform the processing originally belonging to the multiplier block module 220 by using this extra block.

It can be understood from foregoing description that regardless of what the value of the select signal DecFSEL is, the folding block 260 can always perform the job that originally belongs to the multiplier block modules configured as decimation blocks by using the extra clocks produced by the decimation action of these multiplier block modules. Thus, the anti-aliasing filter output signal AAFOUT is always generated by 6 blocks, and accordingly, all the hardware in the multi-rate filter bank 200 is fully utilized and the best performance of the multi-rate filter bank 200 is achieved.

In addition, the folding block state generator 640 includes an adder 641, a selector 642, and a delay unit 643. The adder 641 receives the folding block state FSTAT and adds 1 to the folding block state FSTAT to generate an incremental folding block state. The selector 642 is coupled to the adder 641, and which outputs the incremental folding block state or the folding block state FSTAT by comparing the select signal DecFSEL with the folding block state FSTAT. The delay unit 643 is coupled to the selector 642, and which delays the output of the selector 642 to generate the folding block state FSTAT. Namely, the folding block state FSTAT is increased by 1 during each clock period when the folding block state FSTAT is smaller than the select signal DecFSEL.

Figure 7:
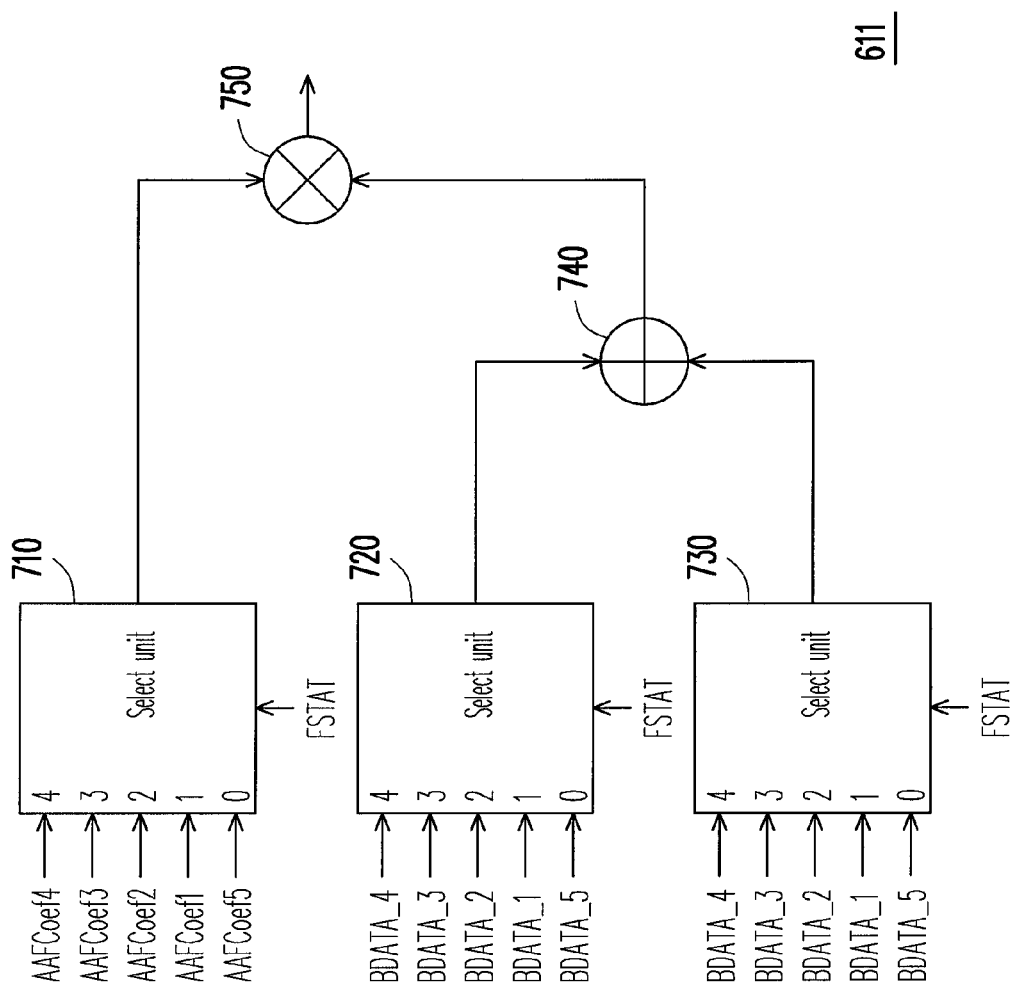
FIG. 7 illustrates an implementation of a shared multiply-adder 611 in FIG. 6.

FIG. 7 illustrates an implementation of the shared multiply-adder 611 in FIG. 6. Referring to FIG. 7, the shared multiply-adder 611 includes select units 710~730. The select unit 710 outputs one of the anti-aliasing parameters AAFcoef1~AAFcoef5 according to the folding block state FSTAT. For example, when the select signal DecFSEL is 1, the folding number is 1, so that when the folding block state FSTAT is 0, the select unit 710 outputs the anti-aliasing parameter AAFcoef5, and when the folding block state FSTAT is 1, the folding block 260 outputs the anti-aliasing parameter AAFcoef1. Since the select signal DecFSEL is 1, the folding block state FSTAT is only up to 1. If the select signal DecFSEL is 4, the select unit 710 sequentially outputs the anti-aliasing parameters AAFcoef5, AAFcoef1, AAFcoef2, AAFcoef3, and AAFcoef4 according to the folding block state FSTAT that is increased from 0 to 4. The select unit 720 sequentially outputs one of the folding input signals BDATA_5 and BDATA_1~BDATA_4 by comparing the folding block state FSTAT with the select signal DecFSEL. The select unit 730 sequentially outputs one of the folding input signals BDATA_5 and BDATA_1~BDATA_4 by comparing the folding block state FSTAT and the select signal DecFSEL. Herein the anti-aliasing parameters AAFcoef1~5 are equivalent to the calculation parameters R1~R5 illustrated in FIG. 2B.

In addition, the adder unit 740 is coupled to the select units 720 and 730 and adds up the outputs of the select units 720 and 730. The multiplication unit 750 is coupled to the select unit 710 and the adder unit 740 and multiplies the outputs of the select unit 710 and the adder unit 740.

If the select signal DecFSEL is not 0 (for example, the select signal DecFSEL is 1), at least one of the multiplier block modules 220~250 has to be configured into a decimation block. As shown in FIG. 2A, the anti-aliasing filter output signal AAFOUT is a combination of the 6 blocks. Thus, if the multiplier block module 220 is configured into a decimation block because the select signal DecFSEL is 1, the anti-aliasing filter output signal AAFOUT becomes a combination of only 5 blocks, wherein the original anti-aliasing filter block is lost. Since herein the multiplier block module 220 performs decimation, the folding block 260 has an extra clock period for processing other data. Accordingly, the folding block state FSTAT of the folding block 260 is 1 during the extra clock period. Herein the outputs of the select units 710, 720, and 730 are respectively the anti-aliasing parameter AAFcoef1 and the block input signals BDATA_1 and BDATA_1. Thus, the folding block 260 accumulates the calculation parameters R1 and R5(R1+R5) illustrated in FIG. 2B by using the accumulation unit 630 within two clock periods. Similarly, when the select signal DecFSEL is 4, the multiplier block modules 220, 230, 240, and 250 are all configured into decimation blocks. The folding block state FSTAT needs to be increased to 4, which means the folding block 260 needs to fold four times to generate the anti-aliasing filter output signal AAFOUT within 5 clock periods by sequentially using the calculation parameters R1, R2, R3, R4, and R5 illustrated in FIG. 2B. In the implementation illustrated in FIG. 7, the select unit 710 sequentially outputs the anti-aliasing parameters AAFcoef5, AAFcoef1, AAFcoef2, AAFcoef3, and AAFcoef4 according to the folding block state FSTAT that is increased from 0 to 4. The select units 720 and 730 sequentially output the block input signals BDATA_5, BDATA_1, BDATA_2, BDATA_3, and BDATA_4 according to the folding block state FSTAT that is increased from 0 to 4.

As described above, in the present invention, whether a plurality of multiplier block modules in a multi-rate filter bank is configured into decimation blocks or expanding anti-aliasing filters is dynamically determined, so that the multipliers and adders in the multi-rate filter bank can be efficiently used. Thereby, most of the hardware circuit in the multi-rate filter bank can be efficiently used in any operation mode and accordingly the performance of the entire circuit is effectively improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multi-rate filter bank, comprising:
an anti-aliasing filter, for receiving an anti-aliasing input signal;
a plurality of multiplier block modules, sequentially coupled with each other in series, for receiving an original signal and generating a plurality of processed signals sequentially, and for receiving a plurality of block input signals and a select signal, wherein each of the multiplier block modules is configured into a decimation block or an expanding anti-aliasing filter according to the select signal;
a folding block, for receiving the select signal and a folding input signal and accumulating the anti-aliasing input signal and the block input signals received by the multiplier block modules that are configured into the decimation block according to the select signal to generate a folding block output signal; and
a data composer, coupled to the anti-aliasing filter, the folding block, and the multiplier block modules, for receiving and composing the folding block output signal and outputs of the multiplier block modules and the anti-aliasing filter and generating an anti-aliasing filter output signal.

2. The multi-rate filter bank according to claim 1 further comprising:
a multiplexer, coupled to the multiplier block modules, for receiving the original signal, the processed signals, and the select signal and outputting the original signal or one of the outputs of the multiplier block modules according to the select signal; and
a data delay device, coupled to the multiplexer, for receiving an output of the multiplexer and a plurality of calculation parameters, and for delaying the output of the multiplexer and performing a calculation based on the calculation parameters to generate the anti-aliasing input signal, the block input signals, and the folding input signal.

3. The multi-rate filter bank according to claim 2, wherein each of the multiplier block modules comprises:
a multiplier block, for receiving a part of the block input signals and the select signal; and
an anti-aliasing filter data switching circuit, coupled to the multiplier block, for receiving the select signal and outputting an output of the multiplier block or a constant according to the select signal.

4. The multi-rate filter bank according to claim 3, wherein the constant is 0.

5. The multi-rate filter bank according to claim 3, wherein the anti-aliasing filter data switching circuit is a selector.

6. The multi-rate filter bank according to claim 2, wherein the calculation parameters comprise a plurality of decimation parameters and a plurality of anti-aliasing parameters.

7. The multi-rate filter bank according to claim 6, wherein each of the multiplier blocks comprises:
a data delay device, for receiving and delaying the original signal or one of the processed signals to generate a plurality of delayed signals;
at least one first shared multiply-adder, coupled between the data delay device and a first data composition unit, for performing an arithmetical calculation on the delayed signals and the decimation parameters or the block input signals and the anti-aliasing parameters according to the select signal and obtaining a plurality of products;
the first data composition unit, coupled to the first shared multiply-adder, for composing the products to generate a composition result;
a decimation unit, coupled to the first data composition unit, for decimating the composition result; and
a select unit, coupled to the decimation unit and the first data composition unit, for outputting the composition result or the decimated composition result according to the select signal.

8. The multi-rate filter bank according to claim 7, wherein the first shared multiply-adder comprises:
a first select unit, for outputting the decimation parameters or the anti-aliasing parameters according to the select signal;

a second select unit, for outputting one of the delayed signals or one of the block input signals according to the select signal;

a third select unit, for outputting another one of the delayed signals or another one of the block input signals according to the select signal;

an adder unit, coupled to the second select unit and the third select unit, for performing an addition on outputs of the second select unit and the third select unit; and a multiplication unit, coupled to the first select unit and the adder unit, for performing a multiplication on outputs of the first select unit and the adder unit.

9. The multi-rate filter bank according to claim 6, wherein the folding block comprises:

at least one second shared multiply-adder, for receiving the select signal, the folding input signal, and the calculation parameters and performing a calculation on the select signal, the folding input signal, and the calculation parameters to obtain at least one product;

a second data composition unit, coupled to the second shared multiply-adder, for composing the product to obtain a composition result; and an accumulation unit, coupled to the second data composition unit, for accumulating the composition result to generate the folding block output signal.

10. The multi-rate filter bank according to claim 9, wherein the folding block further comprises:

a folding block state generator, coupled to the accumulation unit, the folding block state generator comprising:
an adder, for receiving a folding block state and adding 1 to the folding block state to generate an incremental folding block state;
a selector, coupled to the adder, for outputting the incremental folding block state or the folding block state by comparing the select signal with the folding block state; and
a delay device, coupled to the selector, for delaying an output of the selector and generating the folding block state.

11. The multi-rate filter bank according to claim 10, wherein the accumulation unit determines a number of accumulations to be performed according to the folding block state.

12. The multi-rate filter bank according to claim 10, wherein the second shared multiply-adder comprises:

a first select unit, for sequentially outputting the anti-aliasing parameters according to the folding block state and the select signal;

a second select unit, for sequentially outputting a part of the folding input signal according to the folding block state;

a third select unit, for sequentially outputting a part of the folding input signal according to the folding block state;

an adder unit, coupled to the second select unit and the third select unit, for performing an addition on outputs of the second select unit and the third select unit; and a multiplication unit, coupled to the first select unit and the adder unit, for performing a multiplication on outputs of the first select unit and the adder unit.

13. The multi-rate filter bank according to claim 1, wherein each of the multiplier block modules has a block index, and when the select signal is not smaller than the block index of each of the multiplier block modules, each of the multiplier block modules is configured into the decimation block.

14. The multi-rate filter bank according to claim 13, wherein when the select signal is smaller than the block index of each of the multiplier block modules, each of the multiplier block modules is configured into the expanding anti-aliasing filter.

* * * * *